United States Patent
Li et al.

(10) Patent No.: US 9,755,008 B2
(45) Date of Patent: Sep. 5, 2017

(54) ARRAY SUBSTRATE, DISPLAY PANEL AND DISPLAY DEVICE

(71) Applicant: BOE TECHNOLOGY GROUP CO., LTD., Beijing (CN)

(72) Inventors: Guang Li, Beijing (CN); Xinshe Yin, Beijing (CN); Tuo Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/321,383

(22) PCT Filed: Apr. 14, 2016

(86) PCT No.: PCT/CN2016/079257
§ 371 (c)(1),
(2) Date: Dec. 22, 2016

(87) PCT Pub. No.: WO2017/000627
PCT Pub. Date: Jan. 5, 2017

(65) Prior Publication Data
US 2017/0200777 A1    Jul. 13, 2017

(30) Foreign Application Priority Data
Jun. 30, 2015 (CN) .......................... 2015 1 0373255

(51) Int. Cl.
H01L 27/12 (2006.01)
H01L 27/32 (2006.01)

(52) U.S. Cl.
CPC ........ H01L 27/3262 (2013.01); H01L 27/124 (2013.01); H01L 27/1214 (2013.01); H01L 27/3276 (2013.01); H01L 2251/5315 (2013.01)

(58) Field of Classification Search
None
See application file for complete search history.

(56) References Cited

U.S. PATENT DOCUMENTS

2003/0045043 A1* 3/2003 Koyama ................. G09G 3/20
438/200
2013/0075766 A1 3/2013 Chang et al.

FOREIGN PATENT DOCUMENTS

CN 104199205 A 12/2014
CN 105047686 A 11/2015

OTHER PUBLICATIONS

International Search Report dated Jul. 19, 2016 issued in corresponding International Application No. PCT/CN2016/079257 along with an English translation of the Written Opinion of the International Searching Authority.

* cited by examiner

*Primary Examiner* — Cheung Lee
(74) *Attorney, Agent, or Firm* — Nath, Goldberg & Meyer; Joshua B. Goldberg

(57) ABSTRACT

The present invention belongs to the field of display technology, and particularly relates to an array substrate, a display panel and a display device. The array substrate comprises a light-emitting unit, a driving unit for driving the light-emitting unit, and a driving signal unit for providing a driving signal to the driving unit, the driving unit being provided in a central area of the array substrate, the driving signal unit being provided on at least one side of a marginal area surrounding the central area, wherein the light-emitting unit covers the driving unit and extends into the at least one side of the marginal area on which the driving signal unit is provided. The array substrate can have not only enlarged display area but also decreased bezel width, and also have improved aperture ratio of a pixel.

20 Claims, 1 Drawing Sheet

ARRAY SUBSTRATE, DISPLAY PANEL AND DISPLAY DEVICE

This is a National Phase Application filed under 35 U.S.C. 371 as a national stage of PCT/CN2016/079257, filed Apr. 14, 2016, an application claiming the benefit of Chinese Application No. 201510373255.7, filed Jun. 30, 2015, the content of each of which is hereby incorporated by reference in its entirety.

TECHNICAL FIELD

The present invention relates to the field of display technology, and particularly relates to an array substrate, a display panel and a display device.

BACKGROUND

Currently, in the field of display technology, in order to improve user experience in use, main developing trend includes improving display features such as color gamut, pixels per inch PPI and contrast. Also, using narrow bezel is one way to improve the user experience in use without improving display effect of a display device. An advantage of a narrow bezel display device is that a ratio of display area to non-display area is larger, so that the display area looks larger, thereby improving the user experience in use. In addition, a narrow bezel product facilitates application of splicing screen, and can decrease width of a splicing gap and improve overall display effect of the display device. With the popularization of civilian display devices such as mobile phones, televisions and the like, higher requirements on narrow bezel are proposed.

Factors that restrain development of the narrow bezel mainly exist in packaging and horizontal scanning circuit such as gate driver on array (GOA), that is, implementation of narrow bezel is limited by width required by packaging and width occupied by the horizontal scanning circuit like GOA. However, the current horizontal scanning circuit has been simplified a lot, it is more and more difficult to further simplify the horizontal scanning circuit, and chance of making further progress in realizing narrow bezel by using a simple horizontal scanning circuit is small. In addition, design rules are related to process apparatuses, more expensive apparatus and finer process capability are required if stricter design rules are adopted, and thus it can hardly be implemented.

It can be seen that it becomes an urgent technical problem at present to develop other structures and methods that can decrease the bezel of a display device.

SUMMARY

In order to alleviate or solve at least one of the above defects existing in the prior art, the disclosure provides an array substrate, a display panel and a display device, and the array substrate can have a decreased bezel width while having an enlarged display area, and have an improved pixel aperture ratio as well.

According to an aspect of the disclosure, there is provided an array substrate, including a light-emitting unit, a driving unit for driving the light-emitting unit, and a driving signal unit for providing a driving signal to the driving unit, the driving unit being provided in a central area of the array substrate, and the driving signal unit being provided on at least one side of a marginal area surrounding the central area, wherein the light-emitting unit covers the driving unit and extends into the at least one side of the marginal area on which the driving signal unit is provided.

Optionally, central point of the light-emitting unit coincides with central point of the driving unit in an orthographic projection direction.

Optionally, the driving signal unit is arranged in a direction parallel to a direction in which the driving unit is arranged.

Optionally, the light-emitting unit includes a plurality of OLEDs, the driving unit includes a plurality of driving circuits in one-to-one correspondence with the plurality of OLEDs, each driving circuit includes therein a pixel electrode, and anode of each OLED is connected to the pixel electrode of the corresponding driving circuit.

Optionally, the plurality of driving circuits are arranged in a matrix, each driving circuit further includes at least one thin film transistor, the driving signal unit includes a plurality of scan lines, each scan line is connected to gates of the thin film transistors of the driving circuits in a same line; and the driving signal unit further includes a common electrode line, the common electrode line being connected to cathodes of the OLEDs.

Optionally, the scan lines in the driving signal unit and the gates of the thin film transistors in the driving circuits are formed in a same patterning process using a same material.

Optionally, an insulting layer is provided between the light-emitting unit and the driving unit, both the driving unit and the driving signal unit are below the insulating layer, and the driving unit and the driving signal unit have corresponding layer structures in a same layer; and the insulting layer is made of a resin material.

Optionally, the OLEDs are top-emission type OLEDs.

Optionally, the light-emitting unit extends into the at least one side of the marginal area on which the driving signal unit is provided, and just completely covers the driving signal unit provided on said side.

Optionally, the driving signal unit is provided on opposite sides of the marginal area, and the light-emitting unit extends to the opposite sides of the marginal area on which the driving signal unit is provided.

Optionally, the light-emitting unit extends to four sides of the marginal area.

Optionally, area between border of the light-emitting unit and outer edge of the marginal area is a packaging area for providing a sealant.

According to another aspect of the present disclosure, there is provided a display panel including the above array substrate.

According to still another aspect of the present disclosure, there is provided a display device including the above display panel.

The present invention has the beneficial effects as follows.

In the array substrate provided by the disclosure, by extending light-emitting area of the OLEDs to the GOA area without changing distribution area of the driving circuits for driving the OLEDs, the distribution area of the driving circuits is smaller than the light-emitting area of the OLEDs, and the actual effective display area is enlarged, so that the bezel width is decreased while the display area is increased, and the aperture ratio of a pixel is increased as well. In this way, the bezel width can be decreased to width of the applied sealant to the maximum extent, thereby greatly increasing ratio of the display area to the bezel.

Accordingly, the display panel provided by the disclosure includes the structure of the above array substrate, and therefore, with the outer frame having the same size, the display panel can have larger effective display area and smaller bezel width, and the assembly is lighter, slimmer and simpler as well.

The display device provided by the disclosure includes the above display panel, and thus can provide better visual experience to a user.

DETAILED DESCRIPTION

To enable those skilled in the art to better understand the technical solutions of the present invention, an array substrate, a display panel and a display device of the present invention will be described in detail below in conjunction with the accompanying drawings and the specific implementations.

Technical concept of the present invention lies in that, without changing GOA area and packaging size in the non-display area, bezel width is decreased by only extending a light-emitting unit into the GOA area such that an area of the light emitting unit and the GOA area at least partially overlaps with each other in an orthographic projection direction, and in a limiting case, the bezel width is the width of the packaging area (i.e., the packaging width), in view of the following: (1) in an array substrate, layer structures of a thin film transistor of a driving signal unit in the GOA area in the non-display area and layer structures of a thin film transistor of a driving unit in the display area are substantially in the same layers and corresponding layers are formed by a same patterning process, and the light-emitting unit is arranged on the layer structures of the thin film transistor of the driving unit; and (2) layer structures of the light-emitting unit and the layer structures of the thin film transistor of the driving signal unit in the GOA area are made of different materials.

According to one aspect of the present disclosure, there is provided an array substrate in which a light-emitting unit extends to a GOA area (i.e., an area in the non-display area for providing a driving signal unit) such that the light-emitting unit and the driving signal unit at least partially overlaps in an orthographic projection direction, and in this way, narrow bezel structure in an OLED display panel can be realized conveniently.

Figure 1:
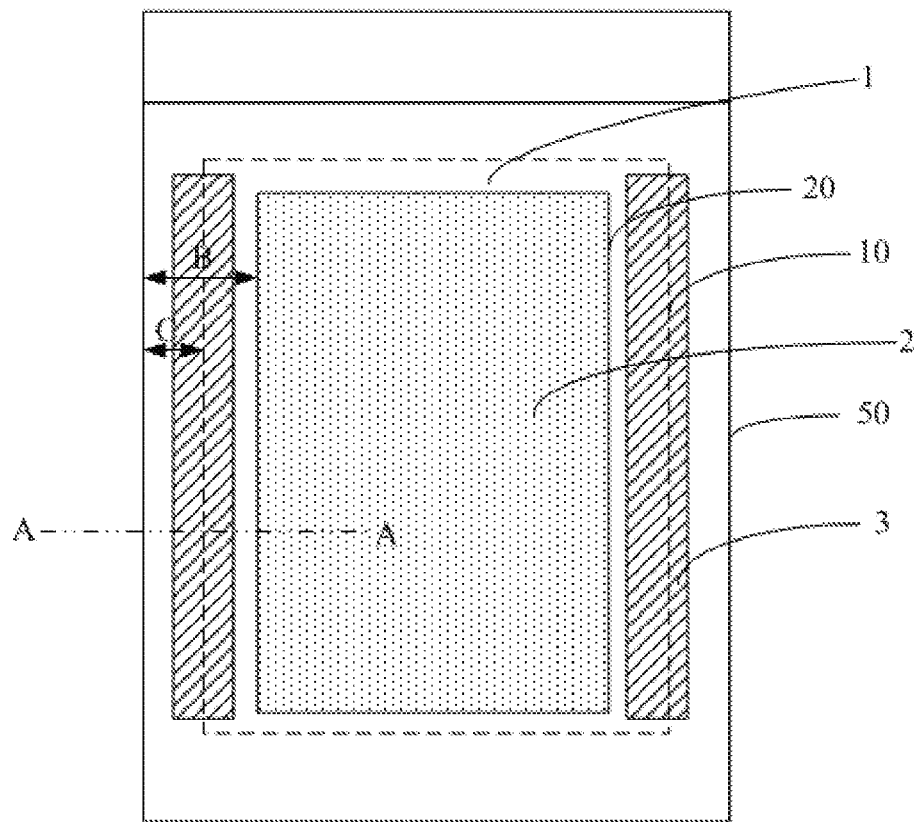
FIG. 1 is a top view of an array substrate in an embodiment of the present invention.

As shown in FIG. 1, the array substrate includes a light-emitting unit 1, a driving unit 2 for driving the light-emitting unit 1, and a driving signal unit 3 (i.e., a driving circuit in a lead wiring area) for providing a driving signal to the driving unit 2, the driving unit 2 is provided in a central area of the array substrate, and the driving signal unit 3 is provided on at least one side of a marginal area surrounding the central area. The light-emitting unit 1 covers the driving unit 2 and extends into the at least one side of the marginal area provided with the driving signal unit 3. In the array substrate shown in FIG. 1, most part of the light-emitting unit 1 is located in the central area, and the other part thereof extends to the area of the marginal area provided with the driving signal unit 3.

In the array substrate in the embodiment, distribution area of the light-emitting unit 1 includes not only the entire central area but also a part of the marginal area, and distribution area of the driving unit 2 includes the central area only. Thus, the distribution area of the driving unit 2 is smaller than that of the light-emitting unit 1. According to general definition, the distribution area of the light-emitting unit 1 is the effective display area (area corresponding to the light-emitting unit 1 is the light-exiting surface of a display panel, i.e., the actual effective display area). Therefore, in the prior art, the effective display area, which actually corresponds to the central area in the present embodiment, includes a light-emitting unit 1 and a driving unit 2 arranged in stacking layers, and the light-emitting unit 1 and the driving unit 2 are both in the central area and have the same distribution area. Therefore, by comparison, a display panel formed using the array substrate of the present embodiment has a larger actual effective display area than a display panel formed using the array substrate of the prior art, in a case where outer frames of the display panels have a same size, and thus has an increased image display area.

In the meanwhile, according to the general definition of bezel of a display panel, distance between border 10 of the light-emitting unit 1 and border of the display panel is defined as bezel width. In the prior art, the bezel width includes packaging width, width of GOA area (i.e., width of area for providing the driving signal unit, and generally in the range of 300 μm to 700 μm), and cutting width. With the development of cutting process, the cutting width can be controlled to be small (about tens of microns). The packaging width, depending on the adopted packaging process (such as laser packaging process or sealant packaging process), ranges from 400 μm to 800 μm. The GOA area corresponds to an area where no light-emitting unit is provided. Therefore, the bezel width of a display panel in the prior art at least includes the packaging width and the width of the GOA area.

Figure 2:
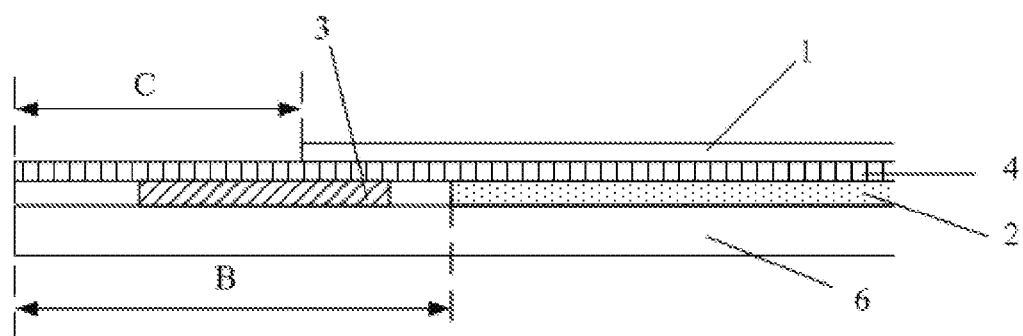
FIG. 2 is a partial cross-sectional view of the array substrate taken along line AA in FIG. 1.

In the partial cross-sectional view of the display panel as shown in FIG. 2, a base substrate 6, as the support for the entire display panel, defines the overall size of the display panel; the driving unit 2 has the same structure as the driving unit 2 in the prior art, but the light-emitting unit 1 extends to the GOA area in the marginal area, i.e., to the GOA area in the non-display area of the prior art, in other words, the light-emitting unit 1 and the GOA area overlap in an orthographic projection direction (i.e., orthographic projections of the light-emitting unit 1 and the GOA area on the base substrate 6 overlap). The area of the light-emitting unit 1 in FIG. 2 is larger than that in the prior art, so that distance from the light-emitting unit 1 to the border of the display panel is decreased, thereby reducing the bezel width. As shown in FIGS. 1 and 2, the distance between the border 10 of the light-emitting unit 1 and the border 50 of the display panel is C (as previously defined, C is the bezel width), and distance between the border 20 of the driving unit and the border 50 of the display panel is B, it is obviously seen that C<B, that is, the bezel width of the display panel in the present embodiment is smaller than that in the prior art, thereby realizing a narrow bezel.

It can be easily understood that, in a limiting case where the light-emitting unit 1 extends to the marginal area to just completely cover the GOA area where the driving signal unit is arranged (not shown), that is, in a case where the light-emitting unit and the driving signal unit 3 share a same border, the distance C between the border 10 of the light-emitting unit and the border 50 of the display panel includes the packaging width only, which significantly decreases the bezel width.

In some embodiments, central point of the light-emitting unit 1 coincides with central point of the driving unit 2 in the orthographic projection direction, so as to facilitate arrangement and alignment of the light-emitting unit 1 and the driving unit 2. The light-emitting unit 1 includes a plurality of OLEDs, the driving unit 2 includes a plurality of driving circuits in one-to-one correspondence with the plurality of OLEDs, each driving circuit includes one pixel electrode, and anode of each OLED is connected to the pixel electrode of the corresponding driving circuit. Specifically, the plurality of driving circuits are arranged in a matrix, and each driving circuit includes at least one thin film transistor; the driving signal unit 3 includes a plurality of scan lines, each scan line is connected to gates of the thin film transistors in the driving circuits in a same line; and the driving signal unit 3 further includes a common electrode line, which is connected to cathode of the OLED to provide a common reference voltage to the OLED.

As shown in FIG. 2, an insulting layer 4 is provided between the light-emitting unit 1 and the driving unit 2 and may be made of a resin material. In this case, the driving unit 2 and the driving signal unit 3 are both below the insulating layer 4 and have corresponding layer structures respectively provided in the same layers. For example, the driving unit 2 includes pixel thin film transistors for driving pixels, the driving signal unit 3 includes scan thin film transistors for driving the pixel thin film transistors by scanning, the pixel thin film transistor and the scan thin film transistor each have a gate, a gate insulating layer, an active layer, a source and a drain, and there is only a slight difference between specific patterns of respective layers of the pixel thin film transistor and the scan thin film transistor.

In some embodiments, scan lines in the driving signal unit 3 and gates of the thin film transistors are formed in a same patterning process using a same material. In addition, in the array substrate, the layer structures of the scan thin film transistor of the driving signal unit 3 in the GOA area of the non-display area and the layer structures of the pixel thin film transistor of the driving unit 2 in the display area are substantially in the same layers, and the corresponding layers are formed in a same patterning process, that it, the scan thin film transistors of the driving signal unit 3 for providing on and off signals to the pixel thin film transistors are formed at the same time when the pixel thin film transistors of the driving unit 2 are formed, and thus bonding process of the driving signal unit 3 (driving chip in the prior art) can be omitted.

Usually, the driving signal unit 3 is arranged on at least one side of the marginal area, and is arranged in a direction parallel to a direction in which the driving unit 2 is arranged. For example, the driving signal unit 3 may be distributed on opposite sides of the marginal area. In some embodiments, the light-emitting unit 1 extends to the opposite sides of the marginal area on which the driving signal unit 3 is provided, and as shown in FIG. 1, the light-emitting unit 1 is extended to right and left sides of the array substrate, so that the left and right parts of the bezel are narrowed. Alternatively, the light-emitting unit 1 is extended to upper and lower sides of the array substrate, so that the upper and lower parts of the bezel are narrowed. Alternatively, the light-emitting unit 1 is extended to four sides, namely, the upper, lower, left and right sides, of the array substrate, so that the left, right, upper and lower parts of the bezel are all narrowed.

In the array substrate provided by the present disclosure, since the light-emitting unit 1 covers the driving unit 2 and extends to the at least one side of the marginal area on which the driving signal unit 3 is provided, that is, the area of the light-emitting unit 1 is larger than that of the driving unit 2, and the number of the OLEDs in the light-emitting unit 1 and the number of the driving circuits in the driving unit 2 are equal, the OLEDs and the driving circuits have different distribution densities or PPIs, and specifically, the PPI of the OLEDs is smaller than that of the driving circuits. Because the OLEDs provided by the present disclosure are top-emission type OLEDs (that is, light exiting direction of the OLEDs is towards a side away from the driving circuits), the difference between PPI of the OLEDs and the PPI of the driving circuits has no influence on normal operation of the array substrate, as long as normal connection between each OLED and the corresponding driving circuit is ensured. In the prior art, the area occupied by the OLEDs is the same as that occupied by the driving circuits in the display area, and the number of the OLEDs is equal to that of the driving circuits, that is, the distribution density or PPI of the OLEDs is the same as that of the driving circuits. In summary, in the array substrate in the present embodiment, the PPI of the driving unit 2 is different from that of the light-emitting unit 1 (the PPI of the light-emitting unit 1 is smaller), which means the effective display area is enlarged and aperture ratio of a pixel is increased.

Accordingly, in the array substrate provided by the disclosure, area between the border of the light-emitting unit 1 and outer edge of the marginal area (i.e., the distance between the boarder 10 of the light-emitting unit and border 50 of the display panel) is the packaging area for providing therein a sealant, and different sealants may be provided according to different packaging processes.

In the array substrate provided by the disclosure, by extending light-emitting area of the OLEDs to the GOA area without changing distribution area of the driving circuits for driving the OLEDs, the distribution area of the driving circuits is smaller than the light-emitting area of the OLEDs, and the actual effective display area is enlarged, so that the bezel width is decreased while the display area is increased, and the aperture ratio of a pixel is increased as well. In this way, the bezel width may be decreased to the width of the applied sealant to the maximum extent, thereby greatly increasing ratio of the display area to the bezel.

According to a second aspect of the disclosure, there is provided a display panel including the above array substrate provided by the disclosure.

The display panel further includes a packaging substrate formed above the array substrate and necessary driving circuit structure(s) (e.g., a driving circuit for providing a data signal for display, and mainly including a data line driving circuit) formed in the marginal area.

The display panel provided by the disclosure includes the structure of the above array substrate, and therefore, with the outer frame having the same size, the display panel can have larger effective display area and smaller bezel width, and the assembly is lighter, slimmer and simpler as well.

According to a third aspect of the disclosure, there is provided a display device including the display panel provided by the disclosure.

The display device may be any product or component having a display function such as an electronic paper, an OLED panel, a mobile phone, a tablet computer, a television, a monitor, a notebook computer, a digital photo frame, a navigator, or the like.

The display device includes the above display panel, and thus can provide better visual experience to a user.

It can be understood that, the above implementations are merely exemplary implementations used for explaining the principle of the present invention, but the present invention is not limited thereto. For those skilled in the art, various modifications and improvements may be made without departing from the spirit and essence of the present inven-

The invention claimed is:

1. An array substrate, comprising a light-emitting unit, a driving unit for driving the light-emitting unit, and a driving signal unit for providing a driving signal to the driving unit, the driving unit being provided in a central area of the array substrate, and the driving signal unit being provided on at least one side of a marginal area surrounding the central area, wherein the light-emitting unit covers the driving unit and extends into the at least one side of the marginal area on which the driving signal unit is provided.

2. The array substrate of claim 1, further comprising a base substrate, wherein central point of orthographic projection of the light-emitting unit on the base substrate coincides with central point of orthographic projection of the driving unit on the base substrate.

3. The array substrate of claim 1, wherein the driving signal unit is arranged in a direction parallel to a direction in which the driving unit is arranged.

4. The array substrate of claim 1, wherein the light-emitting unit comprises a plurality of OLEDs, the driving unit comprises a plurality of driving circuits in one-to-one correspondence with the plurality of OLEDs, each driving circuit comprises therein a pixel electrode, and anode of each OLED is coupled to the pixel electrode of the corresponding driving circuit.

5. The array substrate of claim 4, wherein the plurality of driving circuits are arranged in a matrix, each driving circuit further comprises at least one thin film transistor; the driving signal unit comprises a plurality of scan lines, each scan line is coupled to gates of the thin film transistors of the driving circuits in a same line; and the driving signal unit further comprises a common electrode line coupled to cathodes of the OLEDs.

6. The array substrate of claim 4, wherein the OLEDs are top-emission type OLEDs.

7. The array substrate of claim 5, wherein the scan lines in the driving signal unit and the gates of the thin film transistors in the driving circuits are formed in a same patterning process using a same material.

8. The array substrate of claim 5, wherein the driving signal unit is provided on opposite sides of the marginal area, and the light-emitting unit extends to the opposite sides of the marginal area on which the driving signal unit is provided.

9. The array substrate of claim 5, wherein the light-emitting unit extends to four sides of the marginal area.

10. The array substrate of claim 7, wherein the driving signal unit is provided on opposite sides of the marginal area, and the light-emitting unit extends to the opposite sides of the marginal area on which the driving signal unit is provided.

11. The array substrate of claim 7, wherein the light-emitting unit extends to four sides of the marginal area.

12. The array substrate of claim 1, wherein an insulting layer is provided between the light-emitting unit and the driving unit, both the driving unit and the driving signal unit are disposed below the insulating layer, and the driving unit and the driving signal unit have respective layer structures in a same layer; and the insulting layer is made of a resin material.

13. The array substrate of claim 12, wherein the driving signal unit is provided on opposite sides of the marginal area, and the light-emitting unit extends to the opposite sides of the marginal area on which the driving signal unit is provided.

14. The array substrate of claim 12, wherein the light-emitting unit extends to four sides of the marginal area.

15. The array substrate of claim 1, wherein the light-emitting unit extends into the at least one side of the marginal area on which the driving signal unit is provided, and just completely covers the driving signal unit provided on said side.

16. The array substrate of claim 1, wherein the driving signal unit is provided on opposite sides of the marginal area, and the light-emitting unit extends to the opposite sides of the marginal area on which the driving signal unit is provided.

17. The array substrate of claim 1, wherein the light-emitting unit extends to four sides of the marginal area.

18. The array substrate of claim 1, wherein area between border of the light-emitting unit and outer edge of the marginal area is a packaging area for providing a sealant.

19. A display panel, comprising the array substrate of claim 1.

20. A display device, comprising the display panel of claim 19.

* * * * *